(12) United States Patent
Raynor

(10) Patent No.: US 7,288,801 B2
(45) Date of Patent: Oct. 30, 2007

(54) IMAGE SENSING STRUCTURE

(75) Inventor: Jeffrey Raynor, Edinburgh (GB)

(73) Assignee: STMicroelectronics Ltd., Buckinghamshire (GB)

( * ) Notice: Subject to any disclaimer, the term of this patent is extended or adjusted under 35 U.S.C. 154(b) by 0 days.

(21) Appl. No.: 10/786,878

(22) Filed: Feb. 25, 2004

(65) Prior Publication Data
US 2004/0217359 A1  Nov. 4, 2004

(30) Foreign Application Priority Data
Feb. 26, 2003  (EP)  ................................. 03251149

(51) Int. Cl.
*H01L 31/0328* (2006.01)
(52) U.S. Cl. .................. 257/184; 257/187; 257/226; 257/291
(58) Field of Classification Search ............. 257/233, 257/292, 432, 439, 443, 461
See application file for complete search history.

(56) References Cited

U.S. PATENT DOCUMENTS

| | | | |
|---|---|---|---|
| 6,140,156 A | 10/2000 | Tsai | ................. 438/148 |
| 6,472,699 B1 | 10/2002 | Sugiyama et al. | ........... 257/292 |
| 6,569,700 B2 * | 5/2003 | Yang | ........................... 438/48 |
| 6,661,047 B2 * | 12/2003 | Rhodes | ....................... 257/292 |
| 6,723,594 B2 * | 4/2004 | Rhodes | ....................... 438/200 |
| 2001/0055832 A1 | 12/2001 | Schmitz et al. | .............. 438/57 |
| 2002/0171097 A1 | 11/2002 | Chen et al. | ................. 257/292 |

* cited by examiner

*Primary Examiner*—Wai-Sing Louie
(74) *Attorney, Agent, or Firm*—Lisa K. Jorgenson; Allen, Dyer, Dopplet, Milbrath & Gilchrist, P.A.

(57) ABSTRACT

A CMOS image sensing structure includes a photodiode, in which an epitaxial layer is on a P-type substrate. The photodiode includes an N-well collection node in the epitaxial layer. An isolation trench is provided around the collection node to provide better control of the width of the collection node. The collection node can be surrounded by P-wells or by epitaxial material. It can also be surrounded by epitaxial material with the isolation trench being outwardly extended to ensure compliance with existing design rules.

18 Claims, 3 Drawing Sheets

IMAGE SENSING STRUCTURE

FIELD OF THE INVENTION

The present invention relates to an image sensing structure, and in particular but not exclusively, to an image sensing structure comprising a photodiode that provides highly accurate matching between pixels.

BACKGROUND OF THE INVENTION

Due to tolerances in the manufacturing process of photodiodes used in solid state imaging devices, there is usually a mismatch in sensitivity between pixels. In the case of a camera that takes pictures to be viewed by humans, the tolerances can be relatively low while creating an image of acceptable accuracy. A mismatch of around five percent is acceptable. However, for other applications such as cameras used for machine vision or optical mice, the allowable mismatch is much less, typically around one percent.

One way of improving such a mismatch is to remove it at the system level using calibration and compensation techniques. However, calibration requires special setup and also storage of the compensation coefficients. Compensation requires real-time processing, while costing silicon and consuming power. Hence, both these techniques are complex to perform and are expensive.

The areas of technology requiring an improvement in such a mismatch are the areas that are commercially expanding. Therefore, there is a need for a photodiode structure that provides improved matching between pixels.

SUMMARY OF THE INVENTION

In view of the foregoing background, an object of the present invention is to provide an image sensing structure that improves matching between pixels.

This and other objects, advantages and features in accordance with the present invention are provided by an image sensing structure comprising at least one photodiode comprising a layer of a first conductivity type, and a well of a second conductivity type in the layer. The well defines a collection node for the photodiode. An isolation trench at least partially bounds an upper portion of the well. Alternatively, the isolation trench may completely bound the upper portion of the well.

The isolation trench may comprise a shallow trench isolation (STI). The well may comprise an N-well, and the layer may comprise a P-well or a P-type epitaxial layer. An n-p junction may be formed at an interface between the isolation trench and the well. A width of the photodiode may be less than or equal to 10 micrometers.

Another aspect of the present invention is directed to a method for making an image sensing structure comprising forming at least one photodiode comprising forming a layer of a first conductivity type, and forming an isolation trench in the layer. A well of a second conductivity type is formed in the layer. The well may define a collection node and may be at least partially bounded by the isolation trench.

BRIEF DESCRIPTION OF THE DRAWINGS

The present invention shall now be described, by way of example only, with reference to the accompanying drawings, in which.

DETAILED DESCRIPTION OF THE PREFERRED EMBODIMENTS

In transistor fabrication, multiple transistors of similar conductivity types are commonly located in a single well. In normal use, the well is reverse biased with respect to the transistor and the substrate, and there is virtually no current flowing into or out of the well and transistor. The transistors therefore do not interact, and so the electrical properties of the well are usually ignored.

However, the situation with photodetectors is very different. Incident light creates a current that flows into and/or out of the well, and the well's capacitance often determines the photodetector's sensitivity. Thus, the electrical properties of the well are very important to the operation of the detector. In a CMOS image sensing structure, the voltage out is governed by the equation: Voltage out=(number of photons× quantum efficiency×time×electronic charge)/capacitance of the sense node).

As the light collection (number of photons), conversion (quantum efficiency) and collection process is largely the same for all pixels, the variation in the capacitance of the sense node is the main cause of variations in sensitivity. These variations are due to manufacturing tolerances, and are fixed for a particular sensor, giving the name fixed pattern noise (FPN). Since the variation is fixed and not random, it is more accurately called photo response non-uniformity (PRNU).

Figure 1:
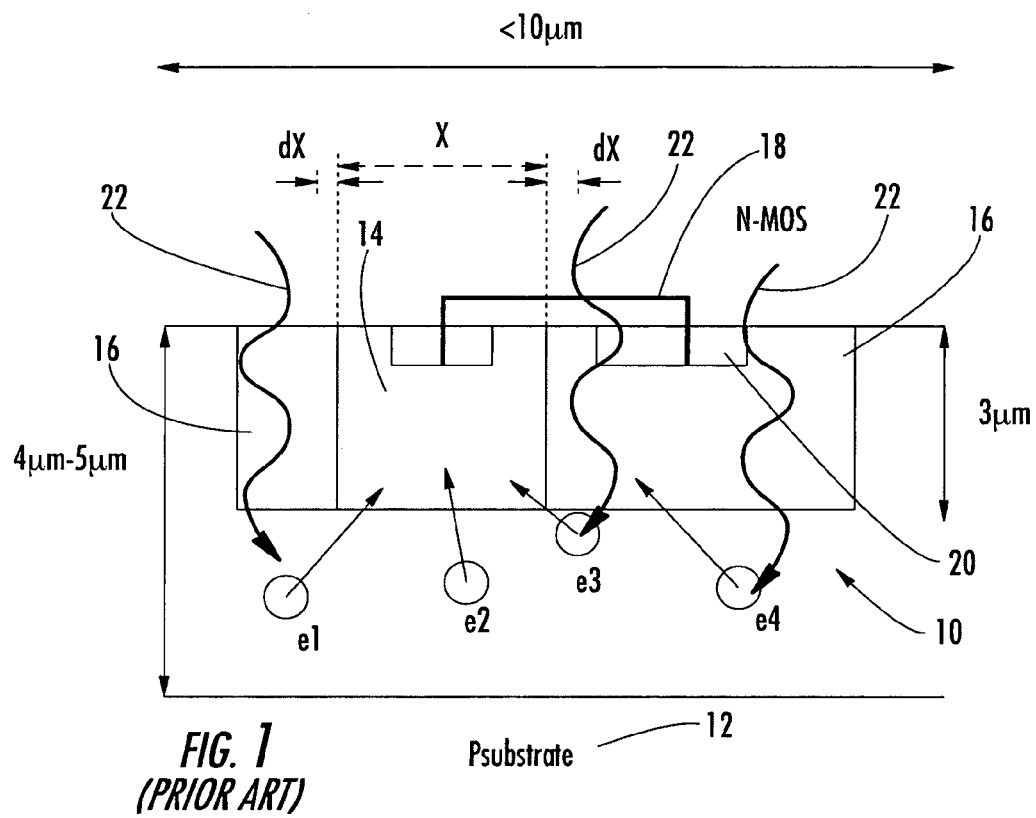
FIG. 1 shows a first prior art image sensing structure.

FIG. 1 shows a common form of a CMOS image sensing structure. An epitaxial layer 10 is formed on a P-type substrate 12. A photodiode comprising an N-well collection node 14 with surrounding P-wells 16 is formed in the epitaxial layer 10. The collection node 14 has a conductor 18 attached which carries a signal to a transistor 20, which is part of the corresponding readout electronics.

The photodiode illustrated in FIG. 1 is a relatively small photodiode, having a width of less than 10 µm. Typically, such a photodiode will have a width of between 4 and 6 µm. As also illustrated in FIG. 1, the epitaxial layer 10 has a depth between 4 and 5 µm, and both the N-well and P-wells have a depth of 3 µm, as measured from the upper surface of the epitaxial layer 10.

Light 22 impinging on the semiconductor produces electron/hole pairs. There is an electron field around the sense node 14 to attract the electrons there. This electron field is a combination of doping and applied voltage. The position at which electrons e1-e4 are freed from the silicon atoms is a statistical process, but is wavelength dependent. For visible light (typical wavelengths from 450 to 650 nm) impinging on silicon, the greatest production of electrons occurs at depths from 1 to 5 µm. To collect as many electrons as possible, a p-n junction should be provided such that that distance the electrons have to diffuse to the junction is minimized. Thus, a p-n junction at around half this depth is optimal. Therefore, an N-Well is usually used to form the p-n junction since it occurs at around this depth.

A problem with this technique is that well implantation is not a critical parameter for CMOS transistors, and hence, is not particularly well controlled. The width of the collection node 14, shown by X in FIG. 1, varies from part-to-part and pixel-to-pixel by a typical variation dX. The value of dX for the photodiode of FIG. 1 is typically ±300 nm. This variation in the width of the collection node 14 causes variation in the capacitance of the photodiode, leading to the abovementioned problem of mismatch between pixels.

Figure 2:
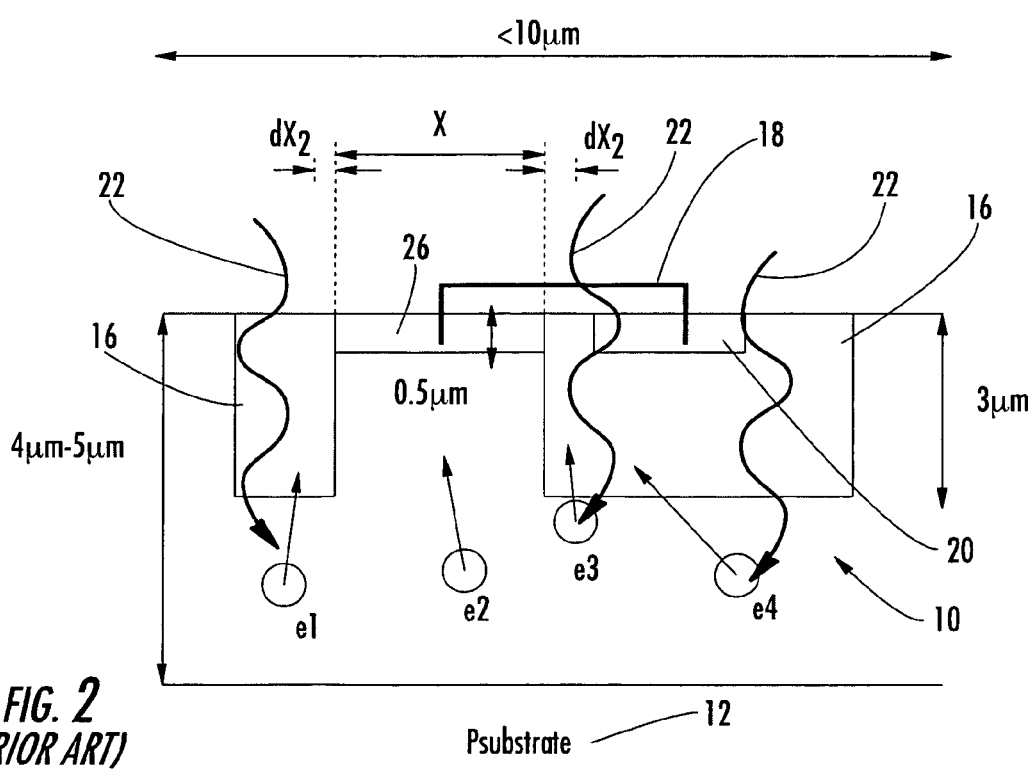
FIG. 2 shows a second prior art image sensing structure.

FIG. 2 shows a modification that can be made to the structure of FIG. 1. Here, an N+implant is used as the collection node. N+is used to construct a transistor 26, and its implantation is very well controlled. The part-to-part and pixel-to-pixel variation, represented by dX 2 in the photodiode of FIG. 2, typically has a value of ±100 nm.

Although this gives a photodiode with a more repeatable capacitance, its shallower depth means that its quantum efficiency is lower. For example, in FIG. 1, photo-generated electrons e1-e3 are most likely to be attracted to the well and be collected. In contrast, in FIG. 2, only electrons e2 will be sensed, with electrons e1 and e3 being lost into the well for the readout circuitry.

Figure 3:
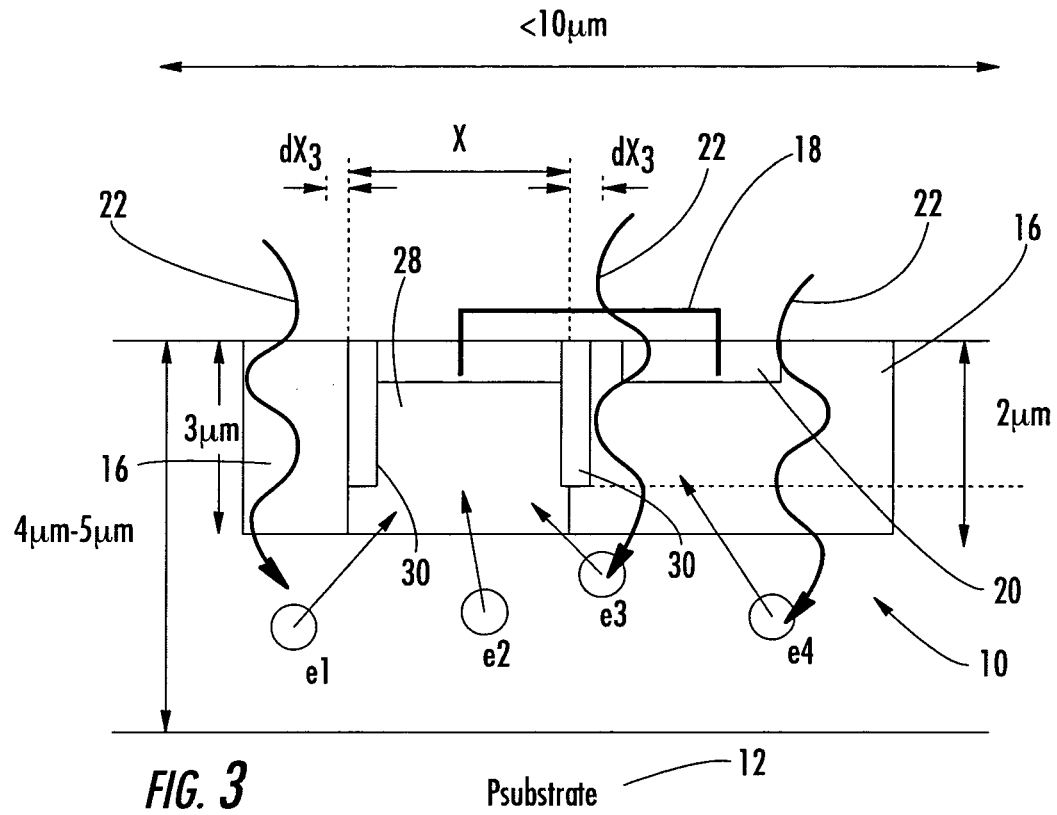
FIG. 3 shows an image sensing structure in accordance with a first embodiment of the present invention.

FIG. 3 shows a first embodiment of the present invention, which provides a deep yet accurate implant. Advanced CMOS technologies use a technique called shallow trench isolation (STI) to control accurately the width of (active) N+ or P+ areas. Photoresist is patterned outside the active areas. Anisotropic etching is used to etch a deep (typically 2 μm) trench. This provides a well defined edge for the implants. After implanting, polysilicon is deposited inside the trenches.

The present invention provides STI 30 around the collection node 28 to provide better control of the width X of the collection node 28. As illustrated in FIG. 3, the N-well collection node 28 and the surrounding P-wells 16 have a depth of 3 μm below the upper surface of the epitaxial layer 10, and the STI has a depth of 2 μm.

In a method of manufacturing the photodiode, the STI is formed prior to implantation of the N-well, thus providing a definite border for the p-n junction to increase control of collection node 28 width X, with a typical value for dX 3 being ±50 nm. This technique combines the advantage of a deep N-well for better quantum efficiency with better control of implantation, and hence capacitance. As dX 3<< dX 1, much better matching is obtained than N-Well implant photodiodes.

Ideally, the STI would be as deep, or deeper than the N-Well, as the p-n junction below the STI is a diffuse barrier. However, STI is usually formed at a depth of 2 μm. This is all that is required for transistors. In this situation, two thirds of the diode's capacitance is controlled accurately, which represents an improvement over the prior art. In addition, it is more economical to remain within the standard process flow, rather than producing a new technology having such an implant.

Figure 4:
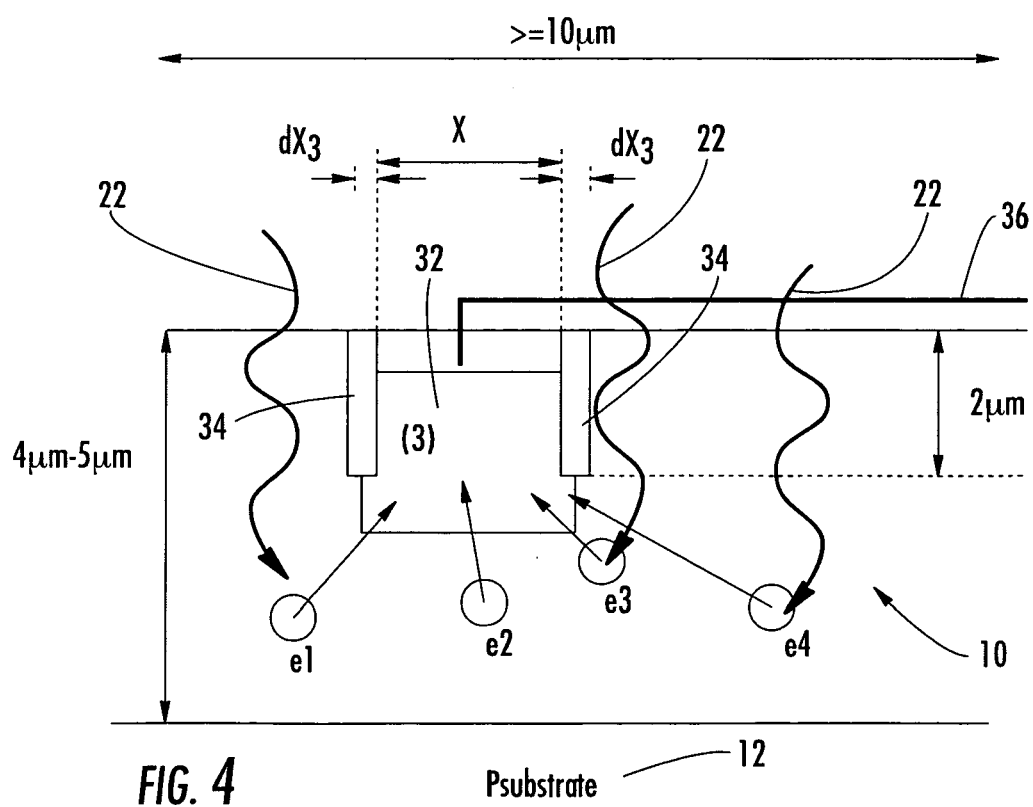
FIG. 4 shows an image sensing structure in accordance with a second embodiment of the present invention.

FIG. 4 illustrates a second embodiment of the present invention, which is applicable for relatively large photodiodes, having widths equal to or greater than 10 μm. Typically, large photodiodes will have widths between 40 and 60 μm. An N-well collection node 32 is bounded by STI 34. To increase sensitivity, the P-well 16 that is shown in FIGS. 1-3 is replaced by P-Epi. This means that all the electrons e1-e4 will most likely be collected by the collection node 32.

The structure of FIG. 4 provides a good approach for photodiodes, but design rule manuals prohibit this implementation for transistor design.

Figure 5:
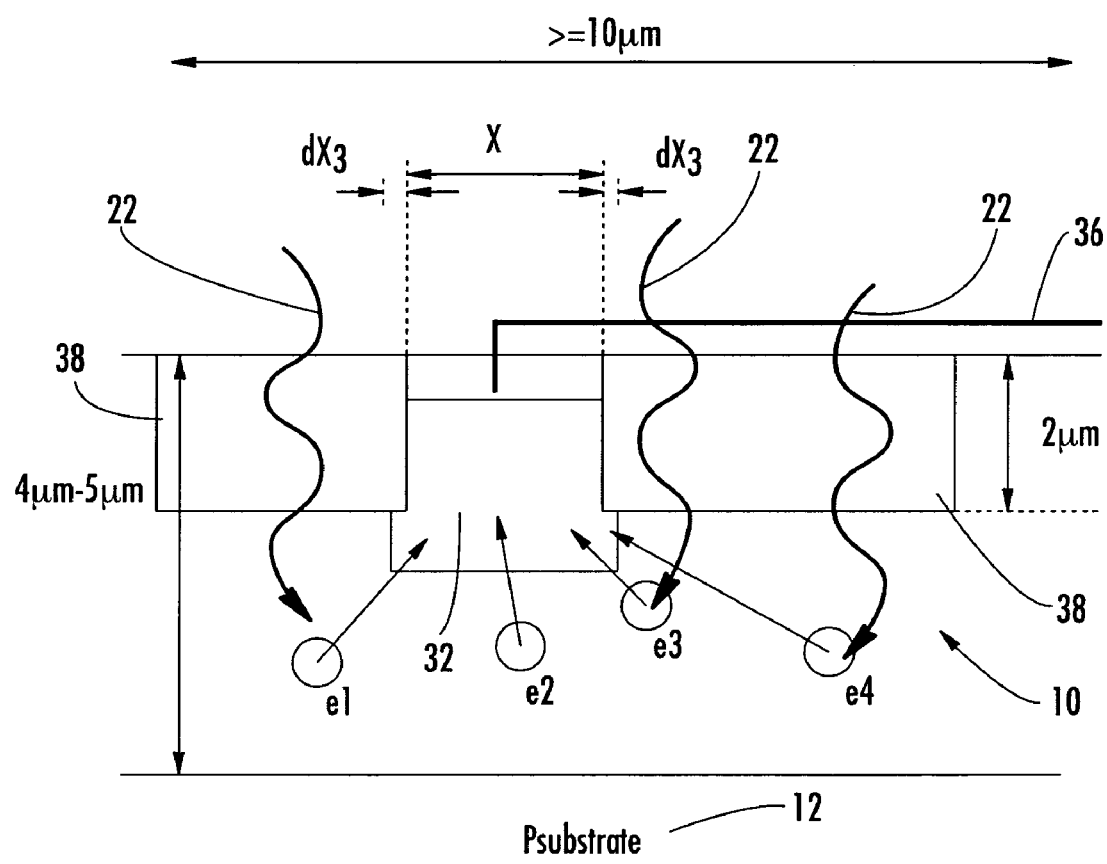
FIG. 5 shows an image sensing structure in accordance with a third embodiment of the present invention.

FIG. 5 shows a photodiode according to a third embodiment of the present invention. The critical n-p junction is at the N-Well/STI interface and is well controlled. However, the STI 34 of FIG. 4 is extended, so that the STI 38 of FIG. 5 extends over most of the pixel, suppressing P+ and hence avoiding DRC issues. This structure obtains good matching, but at the expense in a slight (5%) drop in quantum efficiency.

Variations and modifications can be made to the above without departing from the scope of the present invention. In particular, it will be apparent that the conductivity types of the various materials discussed could be reversed. For example, a P-well could be formed in an N-substrate rather than having an N-well formed in a P-substrate.

That which is claimed is:

1. An image sensing structure comprising:
    at least one photodiode comprising
        a layer comprising a first conductivity type epitaxial layer and having an upper surface,
        a well of a second conductivity type having opposing sides and positioned in said layer comprising the first conductivity type epitaxial layer, said well defining a collection node, and
        an isolation trench at least partially bounding an upper portion of said well at the opposing sides thereof and comprising a shallow trench isolation (STI) having a depth from the upper surface of said layer comprising the first conductivity type epitaxial layer less than the depth of said well.

2. An image sensing structure according to claim 1, wherein said STI completely bounds the upper portion of said well.

3. An image Sensing structure according to claim 1, wherein said well comprises an N-well.

4. An image sensing structure according to claim 1, wherein said layer comprising the first conductivity type epitaxial layer comprises a P-well.

5. An image sensing structure according to claim 1, wherein an upper surface of said at least one photodiode is substantially defined by said STI.

6. An image sensing structure according to claim 1, wherein a width of said at least one photodiode is less than or equal to 10 micrometers.

7. A CMOS image sensing structure comprising:
    a semiconductor substrate; and
    at least one photodiode in said semiconductor substrate and comprising
        a layer comprising a P-type conductivity epitaxial layer and having an upper surface,
        a well of an N-type conductivity having opposing sides and positioned in said layer comprising the P-type conductivity epitaxial layer, said well defining a collection node, and
        an isolation trench at least partially bounding an upper portion of said well at the opposing sides thereof and comprising a shallow trench isolation (STI) having a depth from the upper surface of said layer Comprising the P-type conductivity epitaxial layer less than the depth of said well.

8. An image sensing structure according to claim 7, wherein said STI completely bounds the upper portion of said well.

9. An image sensing structure according to claim 7, wherein an upper surface of said at least one photodiode is substantially defined by said STI.

10. An image sensing structure according to claim 7, wherein an n-p junction is formed at an interface between said STI and said well.

11. An image sensing structure according to claim 7, wherein a width of said at least one photodiode is less than or equal to 10 micrometers.

12. An image sensing structure according to claim 1 wherein the depth of the STI is about 2 μm and the depth of the well is about 3 μu.

13. An image sensing structure comprising:
   at least one photodiode defining a pixel having a width, said at least one photodiode and comprising
      a layer having a first conductivity type and having an upper surface,
      a well of a second conductivity type having opposing sides and positioned in said layer, said well defining a collection node, and
      an isolation trench at least partially bounding an upper portion of said well at the opposing sides thereof and comprising a shallow trench isolation (STI) having a depth from the upper surface of said layer less than the depth of said well and having a width substantially extending over the width of the pixel,
      an n-p junction being formed at an interface between said STI and said well.

14. An image sensing structure according to claim 13, wherein said layer comprises a first conductivity type epitaxial layer.

15. An image sensing structure according to claim 13, wherein said STI completely bounds the upper portion of said well.

16. An image sensing structure according to claim 13, wherein said well comprises an N-well.

17. An image sensing structure according to claim 13, wherein said layer comprises a P-well.

18. An image sensing structure according to claim 13, wherein an upper surface of said at least one photodiode is substantially defined by said STI.

* * * * *

UNITED STATES PATENT AND TRADEMARK OFFICE
CERTIFICATE OF CORRECTION

PATENT NO. : 7,288,801 B2  Page 1 of 1
APPLICATION NO. : 10/786878
DATED : October 30, 2007
INVENTOR(S) : Raynor It is certified that error appears in the above-identified patent and that said Letters Patent is hereby corrected as shown below:

| | |
|---|---|
| Column 3, Lines 7 and 8 | Delete: "N+implant"<br>Insert: -- N+ implant -- |
| Column 3, Line 10 | Delete: "dX 2"<br>Insert: -- dX2 -- |
| Column 3, Line 37 | Delete: "dX 3"<br>Insert: -- dX3 -- |
| Column 3, Line 40 | Delete: "dX 3<<dX 1"<br>Insert: -- dX3 << dX1 -- |
| Column 4, Line 29 | Delete: "Sensing"<br>Insert: -- sensing -- |
| Column 4, Lines 53-54 | Delete: "Comprising"<br>Insert: -- comprising -- |
| Column 5, Line 3 | Delete: "μu"<br>Insert: -- μm -- |

Signed and Sealed this

Twenty-second Day of July, 2008

JON W. DUDAS
*Director of the United States Patent and Trademark Office*